United States Patent [19]

Lur et al.

[11] Patent Number: 5,380,671
[45] Date of Patent: Jan. 10, 1995

[54] METHOD OF MAKING NON-TRENCHED BURIED CONTACT FOR VLSI DEVICES

[75] Inventors: Water Lur, Taipei; D. Y. Wu, Hsin-Chu, both of Taiwan, Prov. of China

[73] Assignee: United Microelectronics Corporation, Hsinchu, Taiwan, Prov. of China

[21] Appl. No.: 258,717

[22] Filed: Jun. 13, 1994

[51] Int. Cl.6 .................... H01L 21/336; H01L 21/76
[52] U.S. Cl. ...................................... 437/41; 437/917; 437/203; 257/752
[58] Field of Search ............. 437/90, 203, 41, 909, 437/917; 257/752, 753, 774

[56] References Cited

U.S. PATENT DOCUMENTS

| | | | |
|---|---|---|---|
| 4,945,070 | 7/1990 | Hsu | 437/160 |
| 4,963,502 | 10/1990 | Teng et al. | 437/41 |
| 5,057,902 | 10/1991 | Haskell . | |
| 5,196,368 | 3/1993 | Thompson et al. | 437/90 |
| 5,216,282 | 6/1993 | Cote et al. | 257/773 |

OTHER PUBLICATIONS

"Simulation of Sub-0.1-μm MOSFET's with Completely Suppressed Short-Channel Effect" by Tanaka et al., IEEE Electron Device Letters, Aug. 1993.

*Primary Examiner*—George Fourson
*Assistant Examiner*—Thomas Bilodeau
*Attorney, Agent, or Firm*—George O. Saile

[57] ABSTRACT

The invention describes a non-trenched buried contact for local interconnections in VLSI devices and provides a method for forming the non-trenched buried contact. By using trenched isolation and a trench polysilicon gate structure the buried contact process can be implemented so that there are no unwanted trenches formed in the area of the buried contact. The invention permits excellent planarization of the device prior to pre-metal dielectric and metal deposition.

13 Claims, 3 Drawing Sheets

METHOD OF MAKING NON-TRENCHED BURIED CONTACT FOR VLSI DEVICES

BACKGROUND OF THE INVENTION

(1) Field of the Invention

The invention relates to an improved buried contact for VLSI devices and to the method for forming the buried contact. The buried contact of this invention is formed without an unwanted silicon trench after buried contact etching. By using trenched isolation and a trench polysilicon gate the buried contact can be formed without the trench problem.

(2) Description of Related Art

As circuit density continues to increase buried contacts are used for local interconnection to minimize chip area. However, a problem with buried contact processes in use today is the formation of a silicon trench after buried contact etching. This unwanted trench results in junction leakage current as well as subsequent planarization problems.

This invention uses trenched isolation and a trenched polysilicon gate to form buried contacts in the fabrication of VLSI devices. This invention results in reduced contact resistance, improved wafer planarization before metal deposition, and improved diffusion junctions. U.S. Pat. No. 5,216,282 to Cotes et al teaches the use of contact studs and has a self alignment technique with contact studs. U.S. Pat. No. 5,196,368 to Thompson et al shows etch and refill technology in general. Performance of trench or grooved gate structures are discussed in "Simulation of Sub-0.1-um MOSFET's with Completely Suppressed Short-Channel Effect," by Tanaka et al in IEEE Electron Device Letters, August 1993.

SUMMARY OF THE INVENTION

It is a principle object of this invention to provide a buried contact for local interconnections in VLSI devices. These contacts are formed without the problem of unwanted trench formation and result in superior wafer planarization before deposition of pre-metal dielectric. Buried contacts have had the problem of an unwanted formation of a silicon trench after buried contact etching. This buried contact trench problem resulted in junction leakage and planarization problems. By using trenched isolation and trenched polysilicon gates a process for forming buried contacts which avoid the formation of unwanted silicon trenches can be implemented thereby achieving the objective.

It is another principle object of this invention to provide a process for forming a buried contact which does not have the problem of the formation of unwanted silicon trenches. This objective is achieved with a buried contact process using trenched isolation and trenched polysilicon gates. Isolation trenches are formed in a silicon substrate and filled with an isolation dielectric. Patterned gate electrode trenches and conductor electrode trenches are then formed in the silicon and isolation dielectric. A layer of gate dielectric is then formed on the side walls, end walls, and bottoms of these trenches and the trenches are filled with polysilicon. The gate oxide is then etched away from the upper part of the side walls and end walls of the contact end of the electrode trenches forming a contact cavity. The contact cavity is then filled with a conductive contact material. This forms a contact with no unwanted trench formation in the silicon. The surface of the silicon substrate can be planarized by etching prior to deposition of pre-metal dielectric.

DESCRIPTION OF THE PREFERRED EMBODIMENTS

Figure 1:
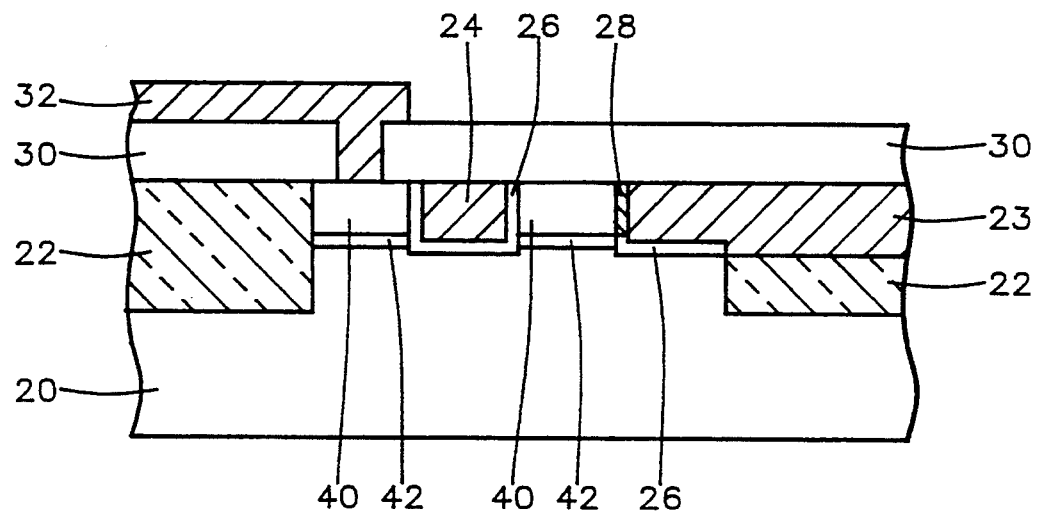
FIG. 1 is a cross section view of device after the device has been completed and the pre-metal dielectric and metal have been formed.

Refer now to FIG. 1, there is shown an embodiment of a VLSI device structure with the buried contact of the current invention. Isolation between devices is provided by the isolation trench regions, about 6000 Angstroms deep, filled with an isolation dielectric 22 such as $SiO_2$ or SiN.

Gate electrode trenches and conductor electrode trenches about 3000 Angstroms deep, are formed in the silicon substrate 20 and the isolation dielectric 22. A layer of gate dielectric 26, such as $SiO_2$, between about 50 and 300 Angstroms thick is formed on the side walls and bottoms of the gate electrode trenches as well as on the side walls, end walls, and bottoms of the conductor electrode trenches which are formed in the silicon substrate 20. Both the gate electrode trenches 24 and the conductor electrode trenches 23 are then filled with polysilicon at the same time. The upper part of the gate dielectric layer 26 formed on the side walls and end walls at the contact end of the conductor electrode trenches are removed after source/drain implantation. A layer of conducting contact material 28, such as doped polysilicon, metal or silicide, for instance, W, $WSi_2$, $TaSi_2$, Ti, TiN, $TiSi_2$, is formed on the upper part of the end walls and side walls of the conductor electrode. The top surface of the substrate is then planarized and a pre-metal dielectric 30 and a metal conductor 32 are formed to complete the device.

The planar surface on the substrate after formation of trenched Gate and buried contact is a considerable advantage for subsequent processing. The absence of any unwanted trenches in the buried contact formation reduces leakage currents and improves device performance. The contact resistance of the buried contact is low, for example less than about 25 ohms for 0.5 microns polysilicon, and the structure helps to minimize device area.

Figure 2:
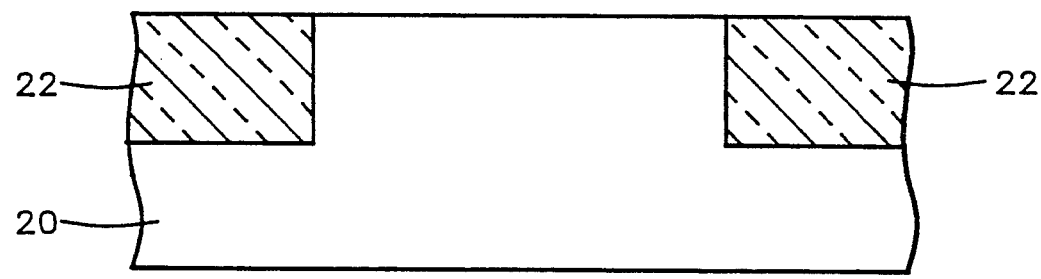
FIG. 2 is a cross section view of the device after the isolation trenches have been formed and filled.
Figure 3:
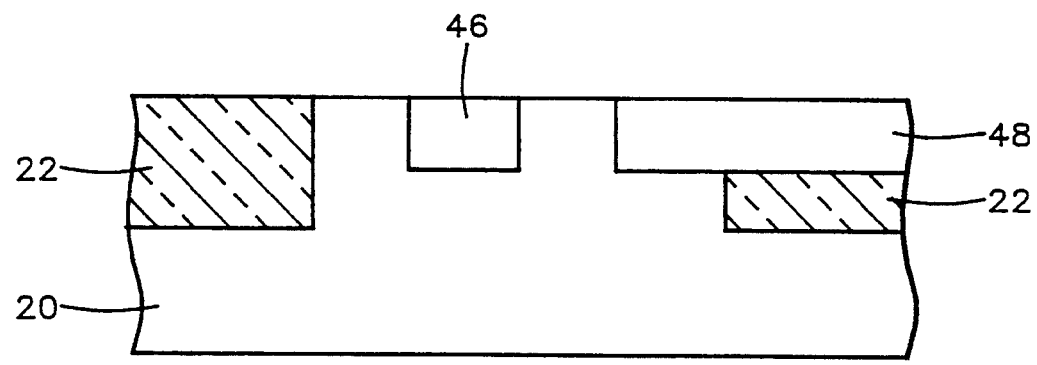
FIG. 3 is a cross section view of the device after the gate electrode trenches and the conductor electrode trenches have been etched.

Refer now to FIGS. 2 through 8, there is shown an embodiment of a method of forming the non-trenched buried contact structure. FIG. 2 shows the silicon substrate 20 where isolation trenches have been etched to a depth of about 6000 Angstroms using reactive ion etching. These trenches are then filled with an isolation dielectric 22 such as $SiO_2$ or SiN. As shown in FIG. 3 a gate electrode trench 46 is etched in the silicon substrate 20 and a conductor electrode trench 48 is etched in the silicon substrate 20 and in the isolation dielectric 22. The gate electrode trench 46 and the conductor electrode trench 48 are etched to a depth of about 3000 Angstroms. The contact end of the conductor electrode trench is that portion etched in the silicon substrate. The conductor electrode trench has an end wall the contact end and also has side walls and a bottom. The gate electrode trench has side walls and a bottom.

Figure 4:
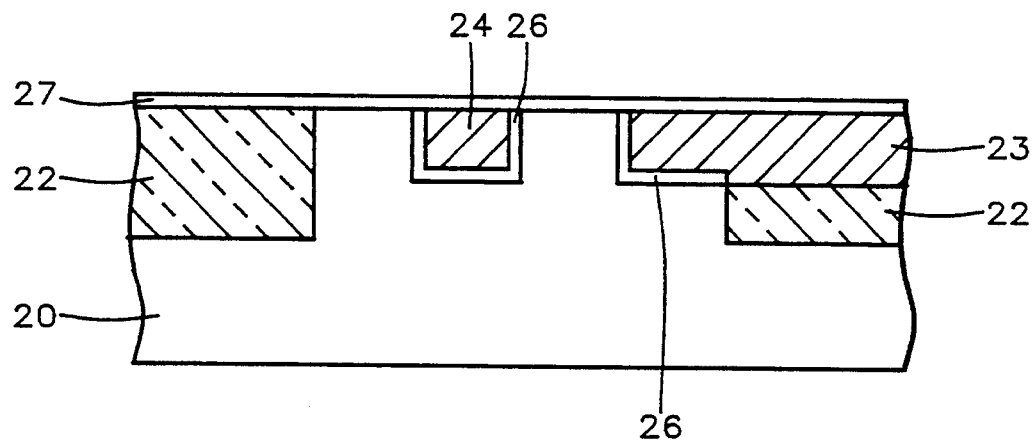
FIG. 4 is a cross section view of the device after the gate electrode trenches and conductor electrode trenches have been filled with polysilicon.

As shown in FIG. 4 a layer of gate dielectric 26, such as $SiO_2$, is formed on the side walls and bottom of the gate electrode trench and on the end wall., side walls, and bottom of the contact end of the conductor electrode trench. The gate dielectric layer 26 is formed by thermal oxidation at a temperature of between about 800° C. and 1000° C. or by using chemical vapor deposition, with a thickness of between about 50 and 300 Angstroms. The gate electrode trench and the conductor electrode trench are then filled with polysilicon using low pressure chemical vapor deposition and doped to the desired concentration level using $POCl_3$ doping or ion implantation. The polysilicon is then etched back to leave polysilicon only in the gate electrode trench 24 and the conductor electrode trench 23. A thin oxide layer 27 between about 100 and 1000 Angstroms thick is then formed over the surface of the substrate.

Figure 5:
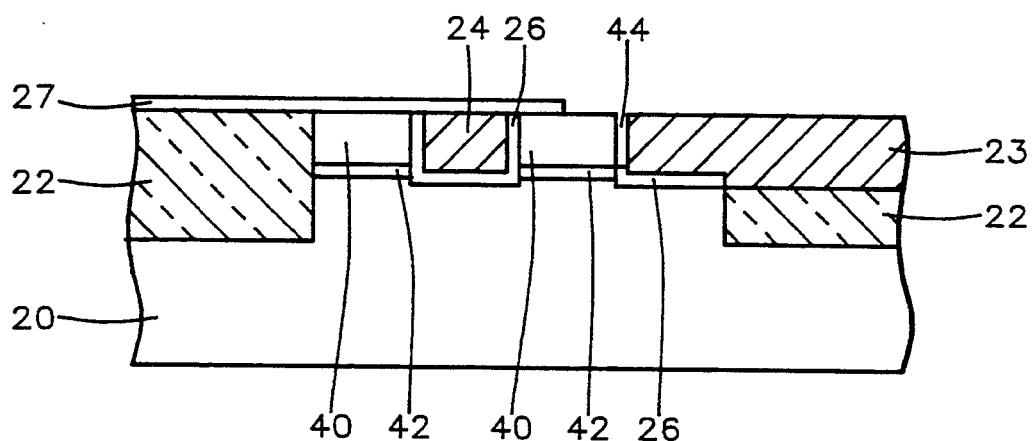
FIG. 5 is a cross section view of the device after the contact cavity has been formed.
Figure 6:
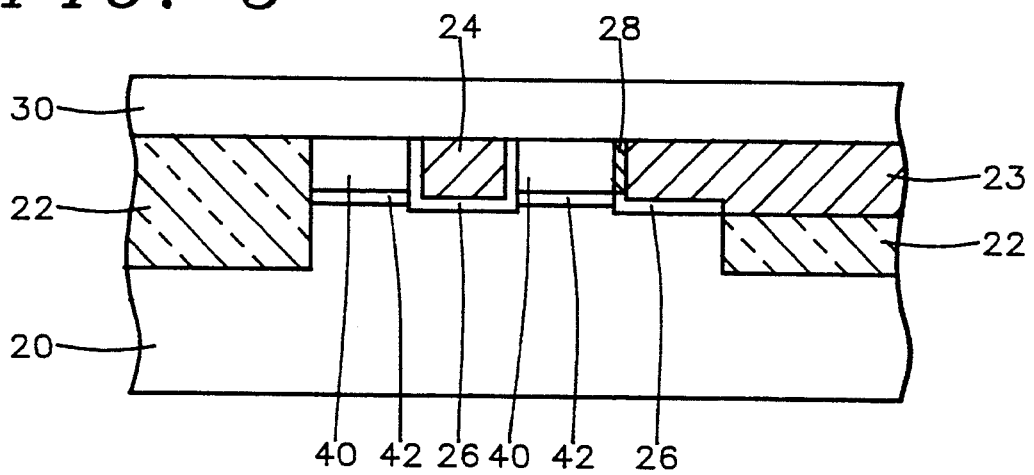
FIG. 6 is a cross section view of the device after the contact cavity has been filled, the substrate has been planarized, and the pre-metal dielectric has been formed.

As shown in FIG. 5 the source/drain regions made up of $N^+$ or $P^+$ regions 40 and $N^-$ or $P^-$ regions 42 are formed using ion implantation. The thin oxide layer 27 is then etched away from the contact end of the conductor electrode trench. The top part of the gate oxide 26 formed on the side walls and end wall at the contact end of the conductor electrode trench is then etched away, using reactive ion etching with $CHF_3$, $O_2$, or the like or dipping HF content solution, forming the contact cavity 44. The alignment of the lithography steps required are not critical. As shown in FIG. 6 the contact cavity is then filled with a conductive contact material 28 such as doped polysilicon, metal, or a silicide using chemical vapor deposition or physical vapor deposition. The surface of the substrate is then etched back so that the conductive contact material remains only in the contact cavity. The surface of the substrate is then covered with a layer of pre-metal dielectric 30.

Figure 7:
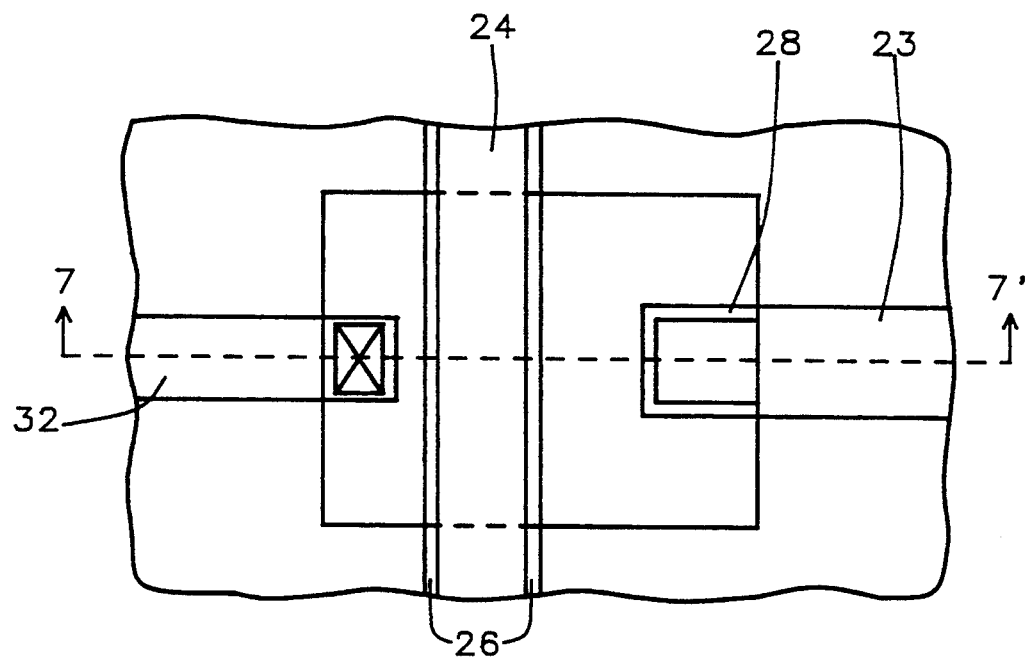
FIG. 7 is the top view of the completed device.
Figure 8:
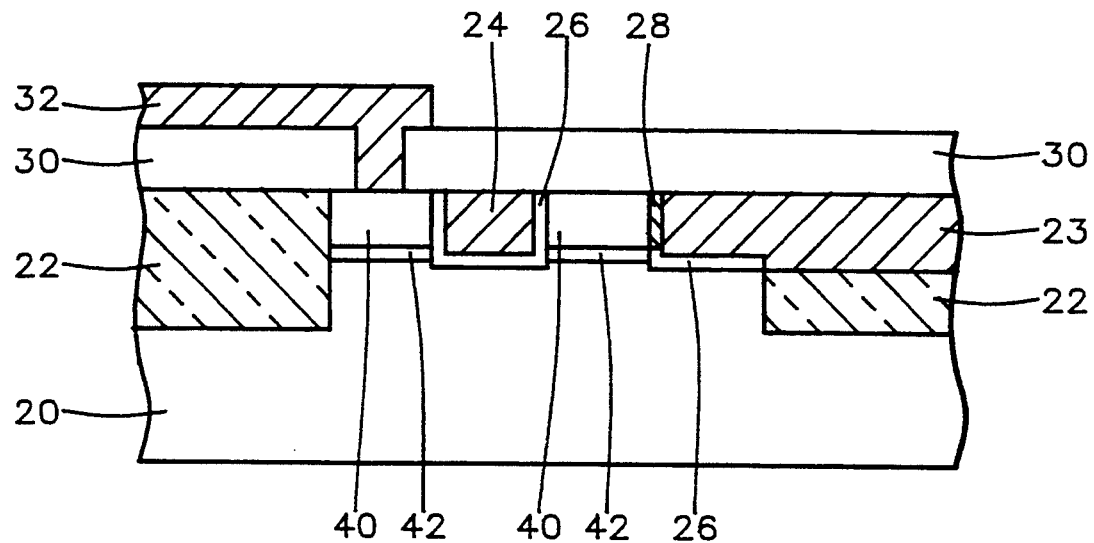
FIG. 8 is a cross section view of the completed device along the line 7-7'.

The completed device after the patterned metal layer 32 has been formed is shown in FIG. 7 and FIG. 8. FIG. 7 shows the top view of the device and FIG. 8 shows a cross section along the line 7-7'. As seen in FIG. 8 the surface of the substrate can be planarized prior to depositing the pre-metal dielectric 30 and the patterned metal layer 32, and there is no unwanted trench formed in the area of the buried contact 28.

While the invention has been particularly shown and described with reference to the preferred embodiments thereof, it will be understood by those skilled in the art that various changes in form and details may be made without departing from the spirit and scope of the invention.

What is claimed is:

1. A method of forming a semiconductor device, comprising the steps of:
   providing a silicon substrate;
   etching isolation trenches in said silicon substrate:
   filling said isolation trenches with an isolation dielectric material:
   etching gate electrode trenches with side walls, end walls, and bottoms in said silicon substrate:
   etching conductor electrode trenches with side walls, end walls, and bottoms in said silicon substrate and said isolation dielectric material wherein said conductor electrode trenches have contact ends;
   forming a gate dielectric layer on said side walls, said end walls, and said bottoms of said gate trenches and on said side walls, said end walls, and said bottoms of said electrode trenches at said contact ends;
   filling a said gate electrode trenches and said conductor electrode trenches with conductive electrode material:
   forming a thin oxide layer on the resulting structure;
   forming source and drain regions in the substrate using ion implant techniques;
   etching said thin oxide layer covering said contact ends of said conductor electrode trenches;
   forming a contact cavity by etching said gate dielectric layer from the top of said side walls and the top of said end walls at said contact ends of said conductor electrode trenches;
   filling said contact cavity with conductive contact material whereby the conductive electrode material is electrically connected to the source or drain; and
   forming a pre-metal dielectric layer over the semiconductor substrate surface.

2. The method of claim 1 wherein said isolation trenches are etched to a depth of between about 4000 and 10,000 Angstroms.

3. The method of claim 1 wherein said isolation dielectric material is $SiO_2$.

4. The method of claim 1 wherein said isolation dielectric material is silicon nitride.

5. The method of claim 1 wherein said isolation dielectric material is borophosphosilicate glass.

6. The method of claim 1 wherein said gate electrode trenches and said conductor electrode trenches are between about 1500 and 6000 Angstroms deep.

7. The method of claim 1 wherein said conductive electrode material is polysilicon.

8. The method of claim 1 wherein said conductive contact material is polysilicon.

9. The method of claim 1 wherein said conductive contact material is a silicide selected from the group consisting of $TiSi_2$, $TaSi_2$, tungsten silicide and molybdenum silicide.

10. The method of claim 1 wherein said conductive contact material is a metal selected from the group consisting of Ti, W, and Al.

11. The method of claim 1 wherein said conductive contact material is TiN or Ti:W.

12. The method of claim 1 wherein said gate dielectric layer is between about 50 and 300 Angstroms thick.

13. The method of claim 1 wherein said gate dielectric layer is $SiO_2$, silicon nitride or $Ta_2O_5$.

* * * * *